United States Patent [19]

Kamioka et al.

[11] Patent Number: 4,898,268

[45] Date of Patent: Feb. 6, 1990

[54] PRINTER CIRCUIT BOARD POSITIONING APPARATUS

[75] Inventors: Yosio Kamioka, Ota; Kazuhiro Hineno, Oizumi; Tuneo Kanazawa, Oramachi, all of Japan

[73] Assignee: Sanyo Electric Co., Ltd., Osaka, Japan

[21] Appl. No.: 128,026

[22] Filed: Dec. 3, 1987

[30] Foreign Application Priority Data

Dec. 10, 1986 [JP] Japan ............... 61-190065[U]

[51] Int. Cl.4 ............................................. B65G 21/20
[52] U.S. Cl. ........................................ 198/345; 29/759; 198/836; 198/624
[58] Field of Search ............... 198/345, 456, 624, 721, 198/836, 339.1; 29/759, 760

[56] References Cited

U.S. PATENT DOCUMENTS

| | | | |
|---|---|---|---|
| 4,493,412 | 1/1985 | Krehnovi | 198/434 |
| 4,542,820 | 9/1985 | Maxner | 198/836 X |
| 4,561,819 | 12/1985 | Wiernicki | 198/624 X |
| 4,660,280 | 4/1987 | Asai et al. | 198/345 X |

FOREIGN PATENT DOCUMENTS

| | | | |
|---|---|---|---|
| 0115515 | 9/1980 | Japan | 198/345 |
| 5929493 | 2/1982 | Japan | |
| 0174022 | 8/1986 | Japan | 198/345 |
| 0263216 | 9/1980 | U.S.S.R. | 198/345 |

Primary Examiner—Robert J. Spar
Assistant Examiner—D. Glenn Dayoan
Attorney, Agent, or Firm—Darby & Darby

[57] ABSTRACT

A printed circuit board positioning apparatus includes a table with a support member, a pair of circuit board guiding/transporting units, a first positioning unit, and a second positioning unit. The pair of circuit board guiding/transporting units is provided on the table to be moved toward or away from the table, sandwiches both end faces of the printed circuit board in a direction perpendicular to a flowing direction of the printed circuit board therebetween, and guides/transports the printed circuit board in its flowing direction. The first positioning unit positions the printed circuit board in the direction perpendicular to the flowing direction using the pair of circuit board guiding/transporting units. The second positioning unit elastically urges both end faces of the printed circuit board in its flowing direction, in association with approaching motion of the circuit board guiding/transporting units toward the table, and before the printed circuit board is supported by the support member on the table. An urging mechanism is additionally provided to one of the circuit board guiding/transporting units which constitutes the first positioning unit and which is movable in the direction perpendicular to the flowing direction of the printed circuit board. The urging mechanism is able to change an urging position when the circuit board is urged in a direction perpendicular to a flowing direction of the printed circuit board.

6 Claims, 5 Drawing Sheets

PRINTER CIRCUIT BOARD POSITIONING APPARATUS

BACKGROUND OF THE INVENTION

1. Field of the Invention

The present invention relates to a printed circuit board positioning apparatus incorporated in an automatic electronic parts mounting machine and, more particularly, to a printed circuit board positioning apparatus which can smoothly position a printed circuit board before electronic parts are mounted thereon.

2. Description of the Prior Art

In a typical conventional printed circuit board positioning apparatus of this type which is incorporated in an automatic electronic parts mounting machine, a guide hole is formed in a printed circuit board surface to serve as a positioning reference, and a guide pin is inserted in the guide hole to accurately position the printed circuit board.

However, in such a conventional printed circuit board positioning apparatus, in order to smoothly insert/remove the guide pin into/from the guide hole formed in the printed circuit board surface, the guide hole is formed to be a circular hole or an elongated hole having a diameter slightly larger than that of the guide pin and hence has a margin. Therefore, during positioning of the circuit board, an insertion position of the guide pin tends to offset from a proper position by an amount of the margin of the guide hole in the printed circuit board, thereby producing an error in positioning of the printed circuit board.

In order to eliminate the above drawback of the conventional apparatus, a printed circuit board positioning apparatus has been proposed as disclosed in Japanese Patent Laid Open (Kokai) No. 59-29493 which is already applied and disclosed in Japan.

In the printed circuit board positioning apparatus disclosed in the above Japanese Patent Disclosure, a pair of circuit board transporting chutes are provided on a table which can be moved in an X-Y direction so that the circuit board transporting chutes oppose each other through a chute support base which can be moved upward/downward. Both end faces in the widthwise direction of the printed circuit board are inserted and held between the pair of circuit board transporting chutes, and one of the circuit board transporting chutes is allowed to move in the widthwise direction of the printed circuit board and elastically urged by an urging means. At the same time, a guide pin extending from the table is inserted in a guide hole of the printed circuit board by downward movement of the circuit board transporting chutes which are moved downward together with the chute support base. Thereafter, one end face in the longitudinal direction of the printed circuit board is elastically urged by a circuit board urging pivoting lever, so that the guide pin is kept urged against a peripheral portion of the guide hole of the printed circuit board. As a result, relative offset between the guide hole of the printed circuit board and the guide pin is prevented, and the printed circuit board can be accurately positioned.

However, when positioning is performed on the basis of end faces of the printed circuit board in a direction perpendicular to a flowing direction thereof and engagement between the guide hole of the printed circuit board and the guide pin, a high packing density of electronic parts to be mounted on the printed circuit board surface is prevented especially because the guide hole for positioning is formed in the printed circuit board surface.

In an apparatus wherein the rear surface of the printed circuit board can be supported by backup pins extending from the table at a predetermined low position of the circuit board transporting chutes which are moved downward together with the chute support base, a position of the printed circuit board in the flowing direction thereof is adjusted on the basis of a contact state between the printed circuit board and the backup pins. In this case, since a friction resistance is produced between the printed circuit board and the backup pins, a large urging force is required for the circuit board urging pivoting lever to elastically urge one end face of the printed circuit board in its flowing direction. In addition, not only the rear surface of the printed circuit board tends to be damaged but also the backup pins are abraded by frequent use over a long period of time. As a result, an error is produced in positioning precision also in the vertical direction of the printed circuit board.

Summary of the Invention

The present invention has been made to eliminate the drawbacks of the conventional printed circuit board positioning apparatus which is incorporated in an automatic electronic parts mounting machine and has as its object to provide a printed circuit board positioning apparatus comprising: a table which can be moved in an X-Y direction and on which a support member for supporting a printed circuit board is provided; a pair of circuit board guiding/transporting means, provided on the table to be moved upward/downward, for sandwiching and holding both end faces in a widthwise direction of the printed circuit board inserted between the pair of circuit board guiding/transporting means and guiding/transporting the printed circuit board in a flowing direction thereof; a first positioning means for moving one of the pair of circuit board guiding/transporting means in a direction perpendicular to the flowing direction of the printed circuit board and elastically urging the printed circuit board in the widthwise direction; and a second positioning means, associated with downward movement of the pair of circuit board guiding/transporting means, for elastically urging both end faces of the printed circuit board in the flowing direction thereof before the printed circuit board is supported by the support member on the table, thereby omitting a guide hole for positioning formed in the printed circuit board surface to improve a high packing density of electronic parts to be mounted thereon, and reducing an urging force required for elastically urging the printed circuit board in the flowing direction thereof to prevent a damage to the printed circuit board and abrasion of the support member.

It is another object of the present invention to additionally provide an eccentric positioning mechanism which can follow a change in size of the printed circuit board in the flowing direction thereof to one of the circuit board guiding/transporting means which constitutes the above first positioning means and can be moved in a direction perpendicular to the flowing direction of the printed circuit board, thereby increasing a degree of freedom in designing of the printed circuit board and mounting electronic parts on both the front and rear surfaces of the printed circuit bard with high precision.

Detailed Description of the Preferred Embodiments

Preferred embodiments of a printed circuit board positioning apparatus according to the present invention will be described below with reference to the accompanying drawings.

Figure 1:
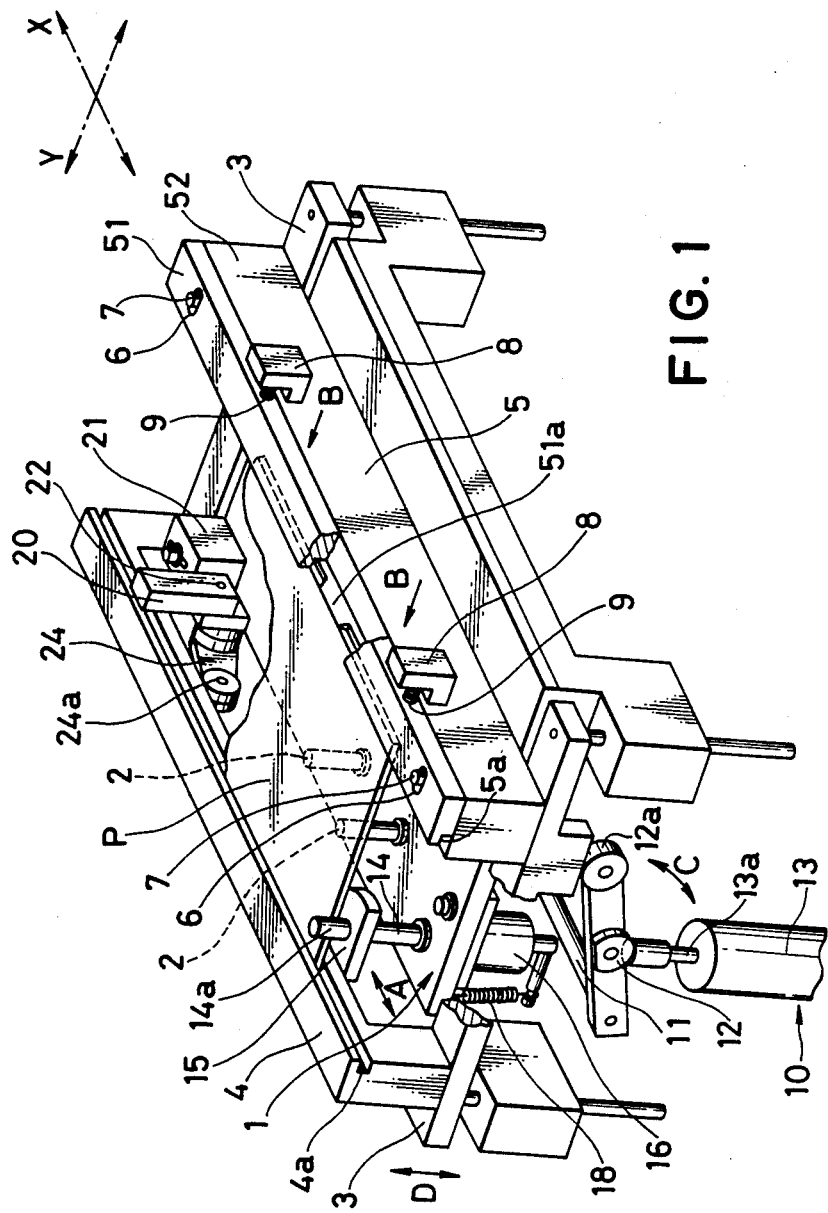
FIG. 1 is a partially cutaway schematic perspective view of an embodiment of a printed circuit board positioning apparatus according to the present invention.

As shown in FIG. 1, reference numeral 1 denotes a table which is incorporated in an automatic electronic parts mounting machine and can be moved in an X-Y direction. Backup pins 2 serving as a plurality of support members extend from the table 1 so as to maintain a predetermined mounting level. A printed circuit board P on which electronic parts are to be mounted is placed on the backup pins 2 through a positioning apparatus to be described later.

That is, a positioning apparatus for the printed circuit board P comprises a pair of circuit board transporting means consisting of a fixed chute 4 and a moving chute 5 provided on the table 1 through chute support bases 3 to oppose each other in a direction perpendicular to a flowing direction of the printed circuit board P. The pair of circuit board transporting chutes 4 and 5 have slide grooves 4a and 5a on their opposite surfaces, respectively. Both end faces of the printed circuit board P in a direction perpendicular to the flowing direction are slidably inserted and held between the slide grooves 4a and 5a so that the printed circuit board P can be guided/transported in its flowing direction A.

The moving chute 5 is divided into an upper moving chute 51 and a lower fixed chute 52 sandwiching the slide groove 5a therebetween. An urging portion 51a is integrally formed in a position of the upper moving chute 51 corresponding to the slide groove 5a and at a central portion along the flowing direction. An elongated hole 6 elongated in a direction perpendicular to the flowing direction of the printed circuit board P is formed in each of both end portions of the upper moving chute 51. A guide pin 7 extends from each of both end portions of the lower fixed chute 52 in the flowing direction so as to correspond to each elongated hole 6. Since each of the guide pins 7 of the lower fixed chute 52 is engaged with a corresponding one of the elongated holes 6 of the upper moving chute 51, the upper moving chute 51 can be moved in a direction perpendicular to the flowing direction of the printed circuit board P.

Each of reference numerals 8 denotes an L-shaped spring holder fixed on the outer surface of the lower fixed chute 52. One end of each of helical compression springs 9 is held by a corresponding one of the spring holders 8, and the other end thereof abuts against the outer surface of the upper moving chute 51. Therefore, the upper moving chute 51 is elastically urged in a direction B perpendicular to the flowing direction of the printed circuit board P, thereby constituting a first positioning means.

A lift unit 10 is provided below each of the chute support bases 3 for supporting the pair of circuit board transporting chutes 4 and 5. Each lift unit 10 comprises an urging lever 12 which pivots about a support shaft 11 and a drive cylinder 13 for moving and pivoting the urging lever 12 in a vertical direction C. When urging rollers 12a provided at free end portions of the urging levers 12 urge against lower portions of the chute support bases 3 and rods 13a of the drive cylinders 13 are vertically moved, the pair of circuit board transporting chutes 4 and 5 supported by the chute support bases 3 is moved in a direction D from an upper printed circuit board supply/discharge standby position to a lower electronic parts mounting level.

Figure 2:
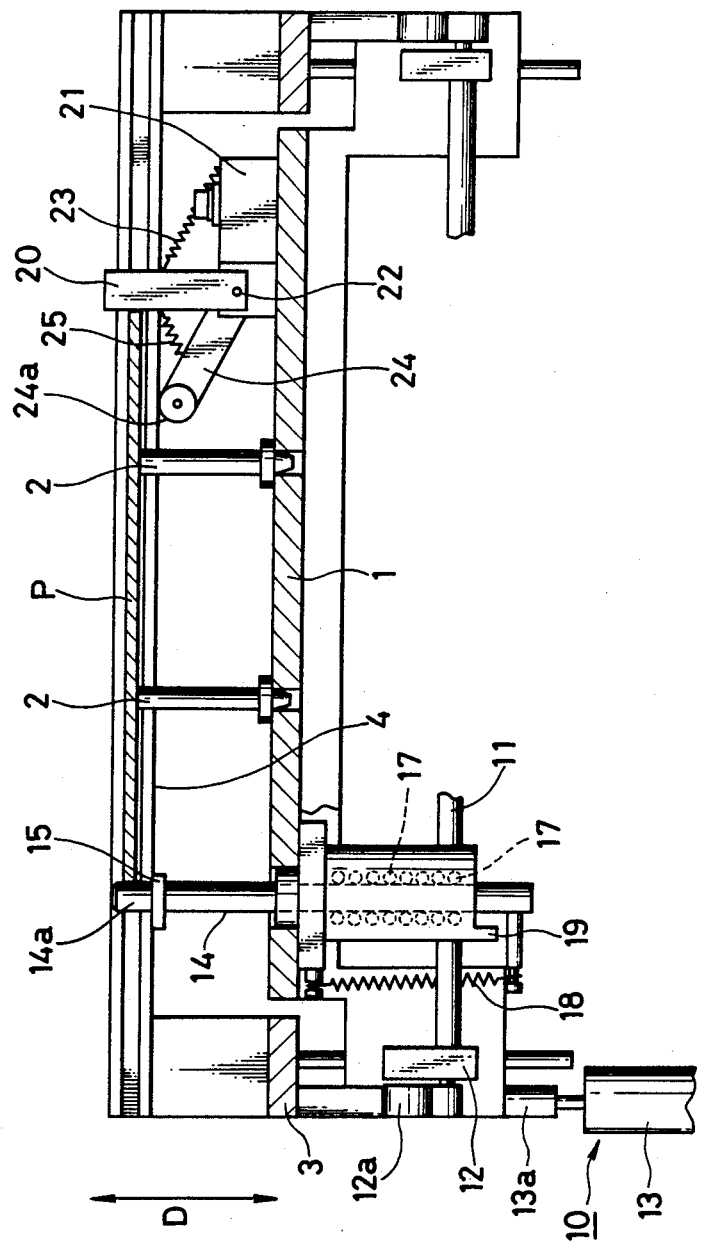
FIGS. 2 to 5 are schematic views for explaining a second positioning means for elastically urging both end faces of a printed circuit board in its longitudinal direction.
Figure 3:
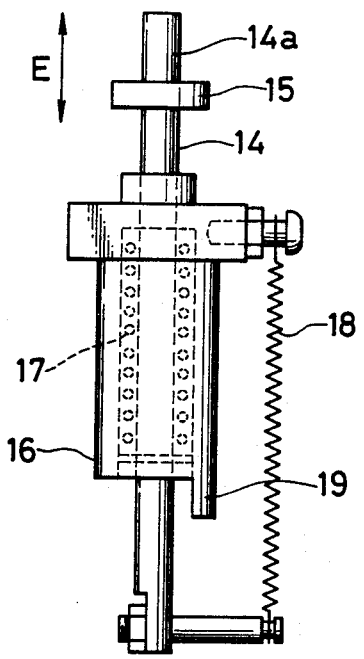

Reference numeral 14 denotes a reference pin for positioning one end face of the printed circuit board P in the flowing direction of the board to be inserted and held between the pair of circuit board transporting chutes 4 and 5. A flange 15 is fitted on and fixed at an upper end portion of the reference pin 14. As shown in FIGS. 2 and 3, the reference pin 14 is inserted in a housing 16 provided below the table 1, moved by a ball bush housed in the housing 16 in a vertical direction E, and normally biased upward by a helical compression spring 18. In upper limit of a lifting stroke of the reference pin 14 is regulated by a stopper 19. Therefore, when the pair of circuit board transporting chutes 4 and 5 is located at the upper printed circuit board supply/-discharge standby position, supply/discharge transportation of the printed circuit board P is not interfered. When the pair of circuit board transporting chutes 4 and 5 is moved downward from the supply/discharge standby position, the rear surface of the circuit board transporting chute 4 abuts against the flange 15 during downward movement of the pair of circuit board transporting chutes 4 and 5. Thus, the reference pin 14 is associated with the downward movement of the chutes 4 and 5. Therefore, the reference pin 14 is moved downward against a biasing force of the helical compression spring 18, and at the same time, one end face of the printed circuit board P in the flowing direction can be positioned by an upper end portion 14a of the reference pin 14, during this downward movement, at the lower mounting level position as shown in FIGS. 1 and 2.

Figure 4:
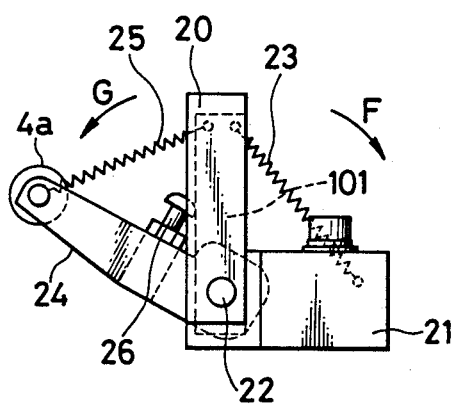
Figure 5:
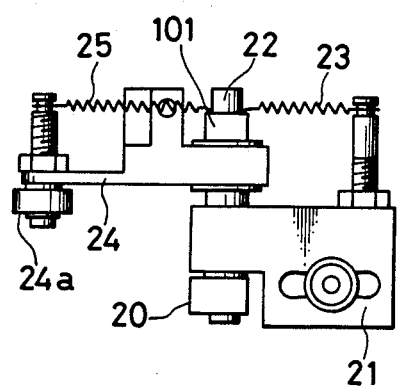

Reference numeral 20 denotes a circuit board urging lever for positioning the other end face of the printed circuit board P in the flowing direction of the board to be inserted and held between the pair of circuit board transporting chutes 4 and 5. Similar to the reference pin 14 described above, the circuit board urging lever 20 is pivotally supported through a support shaft 22 by a support piece 21 provided on the table 1. When the pair of circuit board transporting chutes 4 and 5 is located at the upper printed circuit board supply/discharge standby position, the circuit board urging lever 20 is pivoted in a direction F and kept inclined by a biasing force of a first extension spring 23 provided between a spring hook 101 formed integrally with the circuit board urging lever 20 and the support piece 21 so as not to interfere with downward movement of the printed circuit board P, as shown in FIGS. 4 and 5. A pivoting lever 24 is coaxially supported by the support shaft 22. A free end portion 24a of the pivoting lever 24 urges against a lower surface portion of the fixed chute 4 during downward movement thereof. Therefore, in association with downward movement of the pair of circuit board transporting chutes 4 and 5 from the supply/discharge standby position, the circuit board urging lever 20 which is kept inclined is pivoted in a rising direction G by a biasing force of a second extension spring 25 having a biasing force stronger than that of the first extension spring 23. At the same time, by pivoting motion of the circuit board urging lever 20 in the rising direction G, the other end face of the printed circuit board P in the flowing direction is urged and positioned, thereby constituting a second positioning means together with positioning by the reference pin 14. Note that reference numeral 26 denotes a stopper for regulating a pivoting range of the circuit board pivoting lever 24 in the rising direction F.

An operation of the printed circuit board positioning apparatus according to the present invention will be described below. First, the pair of circuit board guiding/transporting means stands by at a lift position. The both end faces of the printed circuit board P in a direction perpendicular to the flowing direction are inserted between the slide grooves 4a and 5a formed in the opposing surfaces of the pair of circuit board transporting chutes 4 and 5 and then slidably guided/transported by transfer means not shown in the direction of arrow A. In this case, one end face of the printed circuit board P in the direction perpendicular to the flowing direction is elastically urged by the urging piece 51a of the upper moving chute 51 of the moving chute 5 biased by the helical compression spring 9 in the direction of arrow B, thereby the printed circuit board P is stopped at a fixed position while positioning the circuit board P in the direction perpendicular to its flowing direction. In this state, when the cylinder 13 of the lift unit 10 is driven to pivot the urging lever 12 clockwise, the pair of circuit board transporting chutes 4 and 5 is moved downward through the chute support bases 3. During this downward movement, the lower surface of the circuit board transporting chute 4 abuts against the flange 15 provided at the upper end portion of the reference pin 14 to move the reference pin 14 downward through the flange 15 against a biasing force of the helical compression spring 18. At the same time, the upper end portion 14a of the reference pin 14 positions one end face of the printed circuit board P in its flowing direction. When the pair of circuit board transporting chutes 4 and 5 is moved downward, the pivoting lever 24 is pivoted counterclockwise against a biasing force of the first extension spring 23, so that the circuit board urging lever 20 which is kept inclined is pivoted in the rising direction G by a biasing force of the second extension spring 25 having a biasing force stronger than that of the first extension spring 23. By this pivoting motion of the circuit board urging lever 20 in the rising direction, the other end face of the printed circuit board P in its flowing direction is urged by a difference between the biasing forces of the second and first extension springs 25 and 23, thereby positioning the printed circuit board P in its flowing direction before it is placed on the backup pins 2 extending from the table 1. After the printed circuit board P is positioned with reference to the end faces in the direction perpendicular to the flowing direction and those in the flowing direction as described above, the pair of circuit board transporting chutes 4 and 5 is further moved downward by the lift unit 10. As a result, the printed circuit board P is placed on the backup pins 2 extending from the table 1 and then is set on the electronic parts mounting level.

After electronic parts are mounted on the printed circuit board P, the lift unit 10 is driven to lift the pair of circuit board transporting chutes 4 and 5 from the mounting level. In this case, the reference pin 14 and the pivoting lever 24 move in opposite directions, respectively, and a positioning state is released when the printed circuit board P is removed from the backup pins 2.

Figure 6:
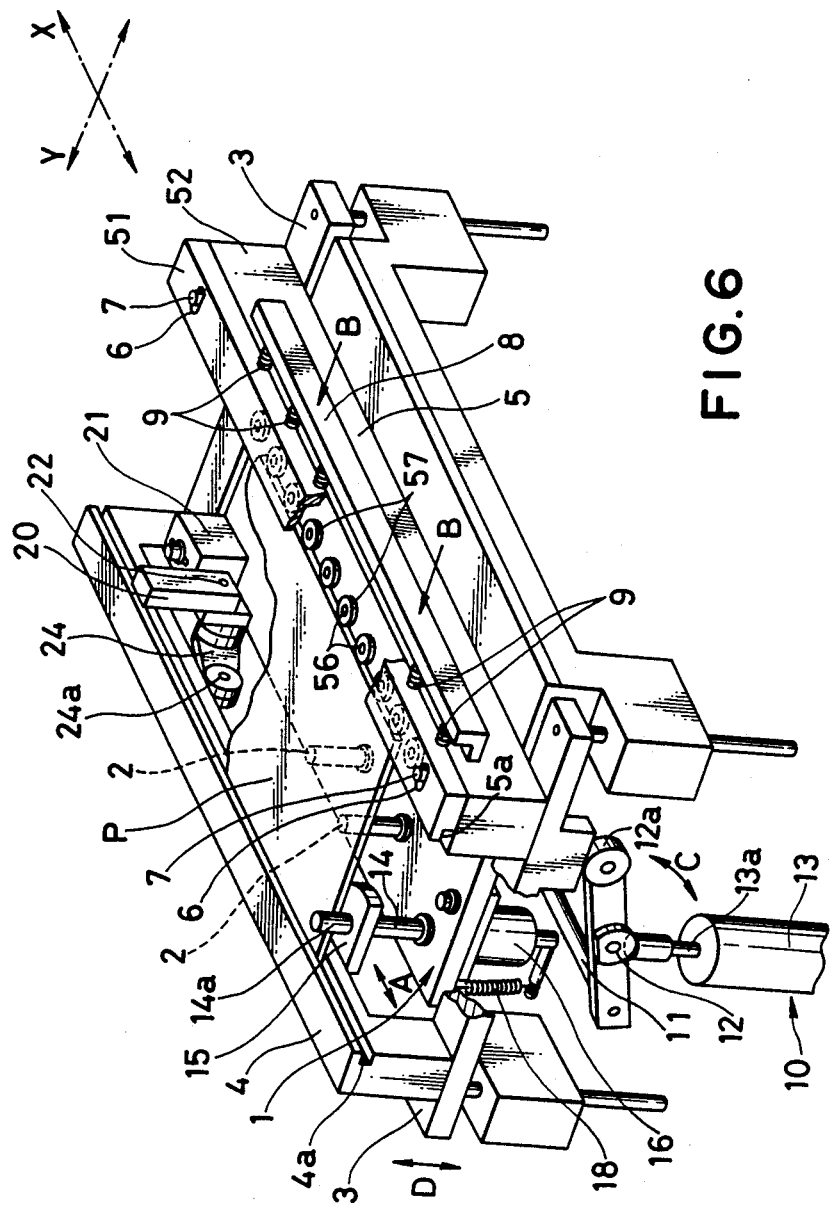
FIG. 6 is a partially cutaway schematic perspective view of another embodiment of a printed circuit board positioning apparatus according to the present invention.
Figure 7:
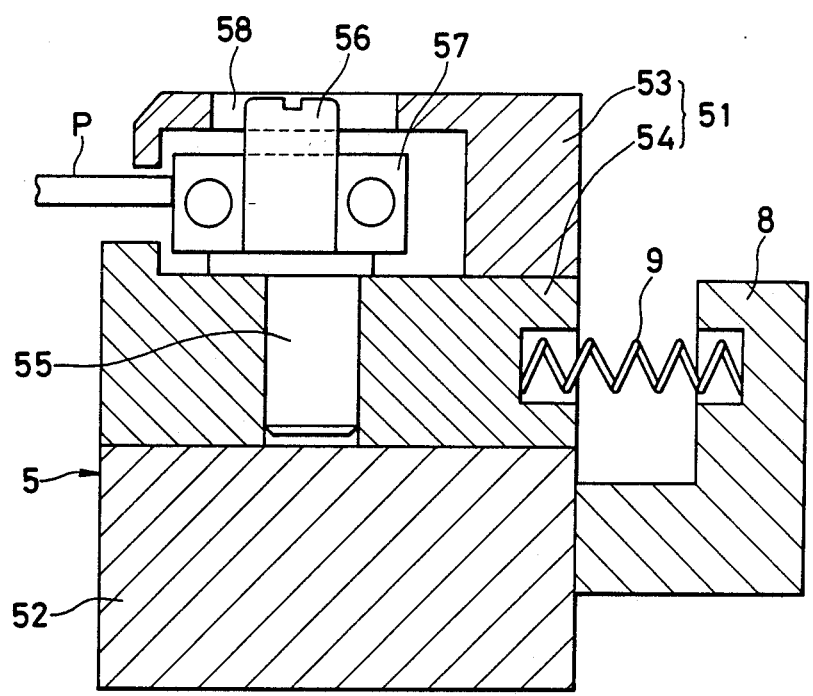
FIG. 7 is a schematic sectional view of a first positioning means for elastically urging an end face of the printed circuit board in a direction perpendicular to its flowing direction.
Figure 8:
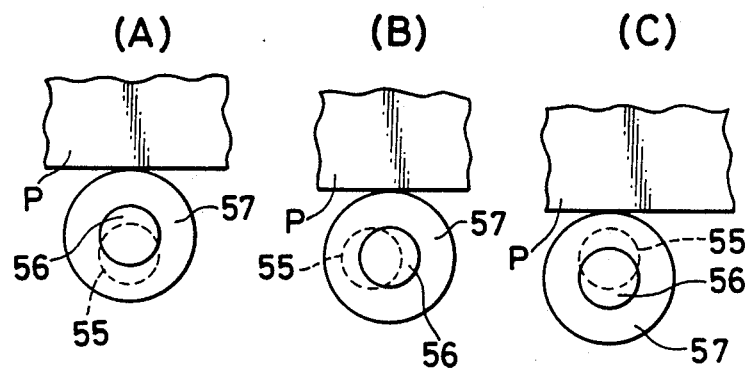
FIGS. 8(A), 8(B), and 8(C) are schematic views for explaining operations of an eccentric positioning mechanism additionally provided to the first positioning means.

FIGS. 6 and 7 show another embodiment of the printed circuit board positioning apparatus according to the present invention. In this embodiment, an urging means consisting of an upper moving chute 51 of a moving chute 5 in the above embodiment is improved. That is, the upper moving chute 51 is separated into an upper chute 53 and a lower chute 54, and a roller 57 which rotates about a rotating shaft 56 is mounted on each of a plurality of eccentric pins 55 extending from the lower chute 54 in its flowing direction. In this case, by offsetting each eccentric pin 55 from a corresponding rotating shaft 56, an eccentric positioning mechanism is constituted. In addition, by adjusting a rotation amount of each eccentric pin 55 through a window 58 formed in the upper chute 53, an eccentric position of a corresponding rotating shaft 56 is adjusted to follow a change in size in the direction perpendicular to the flowing direction of the printed circuit board P, as shown in FIGS. 8(A), 8(B), and 8(C). As a result, a degree of freedom in designing a printed circuit board can be increased, and electronic parts can be mounted on both of front and rear surfaces of the printed circuit board with high precision.

A desired roller 57 can be selectively projected with respect to circuit boards having sizes different in a circuit board flowing direction so that a central portion of the circuit board in its flowing direction can be urged during positioning.

What is claimed is:

1. A printed circuit board positioning apparatus comprising:
   a table having a support member for supporting a printed circuit board;
   guiding/transporting means on said table for guiding the printed circuit board as the circuit board moves in a flow direction over the support member and for transporting the circuit board onto the support member, said guiding/transporting means being formed for holding both end faces of the printed circuit board in a direction perpendicular to the flow direction;
   first positioning means for positioning the printed circuit board in the direction perpendicular to the flow direction thereof by moving said guiding/transporting means;
   a reference member; and
   second positioning means for urging the printed circuit board towards the reference member in the flow direction of the circuit in response to a relative to approaching motion of the circuit board guiding/transporting means toward said table before the printed circuit board is supported by said support member on said table, said first positioning means including an urging mechanism for moving said guiding/transporting means and which changes position in response to the circuit board urging in a direction perpendicular to the flow direction of the printed circuit board, said urging mechanism consisting of a plurality of rotary rollers, in each of which an eccentric position of a rotating shaft can be adjusted.

2. An apparatus according to claim 1, wherein said second positioning means includes elastically urging means.

3. A printed circuit board positioning device comprising:
   a support;
   a reference member;
   means for guiding a printed board in a flow direction over said support;
   means for raising and lowering said guiding means to move the board respectively toward and away from said support, said guiding means including two guide members for holding both end faces of the board;
   first positioning means for moving at least one first of said guide members toward the other of said guide members to thereby position the board in a direction in a direction perpendicular to the flow direction; and
   second positioning means for urging the board toward said reference member in the flow direction in response an approaching motion of the circuit board to said support, said first positioning means including a plurality of rollers and means for eccentrically positioning said rollers in response to differences in sizes of the circuit board.

4. The device as defined in claim 3, wherein said first positioning means is formed to change position for following a change in size of the board in the direction perpendicular to the flow direction.

5. The device as defined in claim 3, wherein said first positioning means includes means for biasing the first of the guide members in the direction perpendicular to the flow direction.

6. The device as defined in claim 3, wherein said second positioning means includes a lever movable in response to said raising and lowering means lowering the circuit board for urging the board toward said reference member in the flow direction.

* * * * *